United States Patent [19]

Rolandi

[11] Patent Number: 5,696,716
[45] Date of Patent: Dec. 9, 1997

[54] PROGRAMMABLE MEMORY ELEMENT

[75] Inventor: Paolo Rolandi, Alessandria, Italy

[73] Assignee: SGS-Thomson Microelectronics S.r.l., Agrate Brianza, Italy

[21] Appl. No.: 794,965

[22] Filed: Feb. 4, 1997

Related U.S. Application Data

[63] Continuation of Ser. No. 413,969, Mar. 31, 1995, abandoned.

[30] Foreign Application Priority Data

Mar. 31, 1994 [EP] European Pat. Off. .............. 94830154

[51] Int. Cl.$^6$ ...................................................... G11C 11/34
[52] U.S. Cl. ............................... 365/185.21; 365/185.05
[58] Field of Search ........................... 365/205, 185.05, 365/185.21, 185.09, 154, 156, 189.05

[56] References Cited

U.S. PATENT DOCUMENTS

| | | | |
|---|---|---|---|
| 4,802,138 | 1/1989 | Shimamune | 365/185.21 |
| 4,809,225 | 2/1989 | Dimmler | 365/154 |
| 4,933,906 | 6/1990 | Terada | 365/185.21 |
| 5,040,148 | 8/1991 | Nakai | 365/185.21 |
| 5,237,530 | 8/1993 | Takashina | 365/185.21 |
| 5,524,094 | 6/1996 | Nobukata | 365/185.21 |

FOREIGN PATENT DOCUMENTS

WO 90/12402  10/1990  WIPO ..................... G11C 11/40

OTHER PUBLICATIONS

Donaldson et al., "SNOS 1K×8 Static Nonvolatile RAM," *IEEE Journal of Solid–State Circuits* SC–17(5):847–851, Oct. 1982.

Gaw et al., "A 100ns 256K CMOS EPROM," in *IEEE International Solid–State Circuits Conference*, New York, NY, Feb. 14, 1985, pp. 164–165.

Terada et al., "120-ns 128K×8-bit/64K×16-bit CMOS EEPROM's," *IEEE Journal of Solid–State Circuits* 24(5):1244–1249, Oct. 1989.

*Primary Examiner*—A. Zarabian
*Attorney, Agent, or Firm*—David V. Carlson; Seed and Berry LLP

[57] ABSTRACT

A non-volatile memory element with dual programmable cells and associated read circuit, which comprises a circuit of the bistable type connected between the two memory cells, to which it is coupled through first and second switching circuit elements.

Such switching elements enable a single initial write step by one of the two memory cells only, and thereafter, enable connection of the clear cell and the programmed cell to the bistable circuit.

18 Claims, 2 Drawing Sheets

PROGRAMMABLE MEMORY ELEMENT

CROSS-REFERENCE TO RELATED APPLICATION

This application is a continuation of U.S. patent application Ser. No. 08/413,969, filed Mar. 31, 1995, now abandoned.

TECHNICAL FIELD

This invention relates to memory elements for semiconductor non-volatile storage devices, in particular memory elements for redundancy circuits in such devices.

BACKGROUND OF THE INVENTION

Semiconductor storage devices generally comprise a two-dimensional matrix arrangement of memory elements of the cell type including a field-effect transistor, which elements are located at the intersections of rows (word lines) with columns (bit lines).

In order to write or read elementary information to/from a memory element, one must be able to select the row/column crossing where that memory element is located.

For this selection, row address signals and column address signals are used that are decoded independently of each other and constitute the so-called "address" of the memory element.

In a monolithically integrated, semiconductor storage device, it often happens that a limited number of memory elements included in the matrix of memory elements exhibit such faults as may impair their operation.

To avoid allowing the presence of a few inoperative memory elements to impair the operability of the whole device, it has been known to employ additional memory elements, commonly termed "redundant memory elements", which can be substituted for memory elements that have been found faulty during testing.

Those circuits of the device that permit activation and proper connection of such substitutes in the overall operation of the device constitute the so-called "redundancy circuit".

The aggregate of the redundant memory elements and the redundancy circuit represent the device "redundancy".

In a storage device, the redundancy circuit comprises programmable non-volatile storage registers that can store address configurations therein. These address configurations correspond to the locations of the faulty memory elements that are to be isolated, i.e., unused during device operation.

Such registers are programmed once during device testing, and thereafter store the programmed information throughout the device life, even in the event of power-offs.

A circuit for programming memory cells in a non-volatile storage register used for the redundancy of a semiconductor storage device is disclosed, for example, in European Patent No. 93830474.8, which is incorporated by reference.

As a storage device that includes digital integrated circuits is turned on, or when its operation is resumed after an interruption in the power supply, a set of initial operations is carried out to allow the various elements in the storage device to take predetermined states.

Where no external signals are provided to time such power-on resetting operations, the storage device is provided with an internal arrangement effective to generate initiating pulses for the operations.

The reading of those memory cells that contain information about the addresses of the faulty memory elements to be substituted with redundant elements is a static type, i.e., performed once upon the storage device being turned on (or when its operation is resumed after an interruption in the power supply), and the information stored in such cells is transferred to a bistable type of storage circuit for storage therein.

However, flip-flops also require that a resetting pulse be supplied upon the device turning on, as well as each time that the supply voltage drops below a value regarded as an acceptable minimum for reliable operation and then rises again.

In this way, any likelihood of the flip-flops being set to an inappropriate initial state, such as would lead to a faulty memory reading, is avoided.

Well known in the pertinent art are several different power-on resetting circuits, which are also employed in other applications and referred to in the literature as Power-On Reset (abbr. POR) circuits, such circuits being effective to detect drops and rises in the supply voltage and generate suitable reset pulses.

In the design of such reset circuits, various requirements are taken account of, such as operation unaffected by variations in the rise characteristic of the supply voltage, minimum required time for a fresh pulse to be generated, and minimum required time for the supply voltage drop to cause a pulse to be generated.

An important requirement of CMOS-type integrated circuits, which typically compose the circuits of such storage devices, is that direct current (DC) consumption should be low while the resetting circuit is in a quiescent or standby state.

The last-mentioned requirement clashes, in a sense, with the previously mentioned ones, and a reasonable static power consumption is often accepted in order to provide resetting circuits that are both reliable and better performing from the other aspects.

SUMMARY OF THE INVENTION

In accordance with one aspect of the present invention, a memory element that can be programmed with a programming circuit is provided. The memory element includes a bistable circuit that has first and second terminals and dissipates substantially zero power in a quiescent state. The memory element also includes first and second nonvolatile memory cells. First and second switching elements are interposed between the first and second cells and the first and second terminals respectively, and couple the cells to the programming circuit during a write cycle and to the terminals during a read cycle.

A technical advantage of one aspect of the invention is a memory element, suitable for use in the non-volatile storage registers of redundancy circuits for storage devices, which has a read circuit with a flip-flop type of circuit that eliminates the need for a POR-type resetting circuit.

BRIEF DESCRIPTION OF THE DRAWINGS

The features and advantages of a memory element with read circuit according to the invention will be apparent from the following description of an embodiment thereof, to be taken by way of example and not of limitation in conjunction with the accompanying drawings.

DETAILED DESCRIPTION OF THE INVENTION

Figure 1:
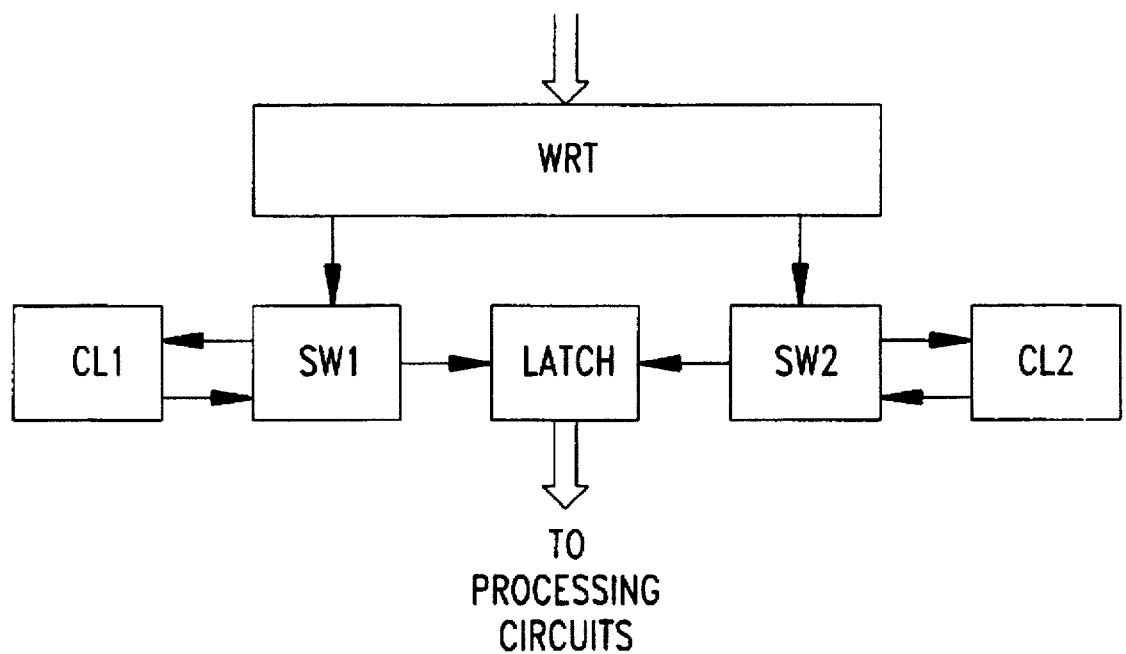
FIG. 1 is a block diagram of a memory element with read circuit according to the invention.

In the block diagram of FIG. 1, the memory element is represented by blocks CL1 and CL2. According to one aspect of the invention, CL1 and CL2 are a pair of programmable, non-volatile memory cells that can be implemented in CMOS technology as field-effect transistor memory cells. These cells can be programmed, using conventional technologies, by applying appropriate voltages to their terminals. For example, referring to FIG. 3, either of cells CL1 and CL2 can be programmed by applying approximately 12.5 volts to the gate, 6.25 volts to the drain, and 0 volts voltages are supplied, in one embodiment, by connecting the node marked $V_{DD}$ of transistors 12a and 12b respectively, to 6.5 volts, and the gate of CL1 and CL2 to 12.5 volts (this gate also being marked as $V_{DD}$ but being at a different voltage potential drain than the drain of 12a or 12b during the programming step). The input from the WRT to the gate of either 12a or 12b, as desired, programs the respective memory cell, whether CL1 or CL2 (see FIG. 2). Normally, if the memory cell CL1 is virgin the other cell CL2 is programmed and vice versa. These conditions depend on which address is to be stored.

Figure 2:
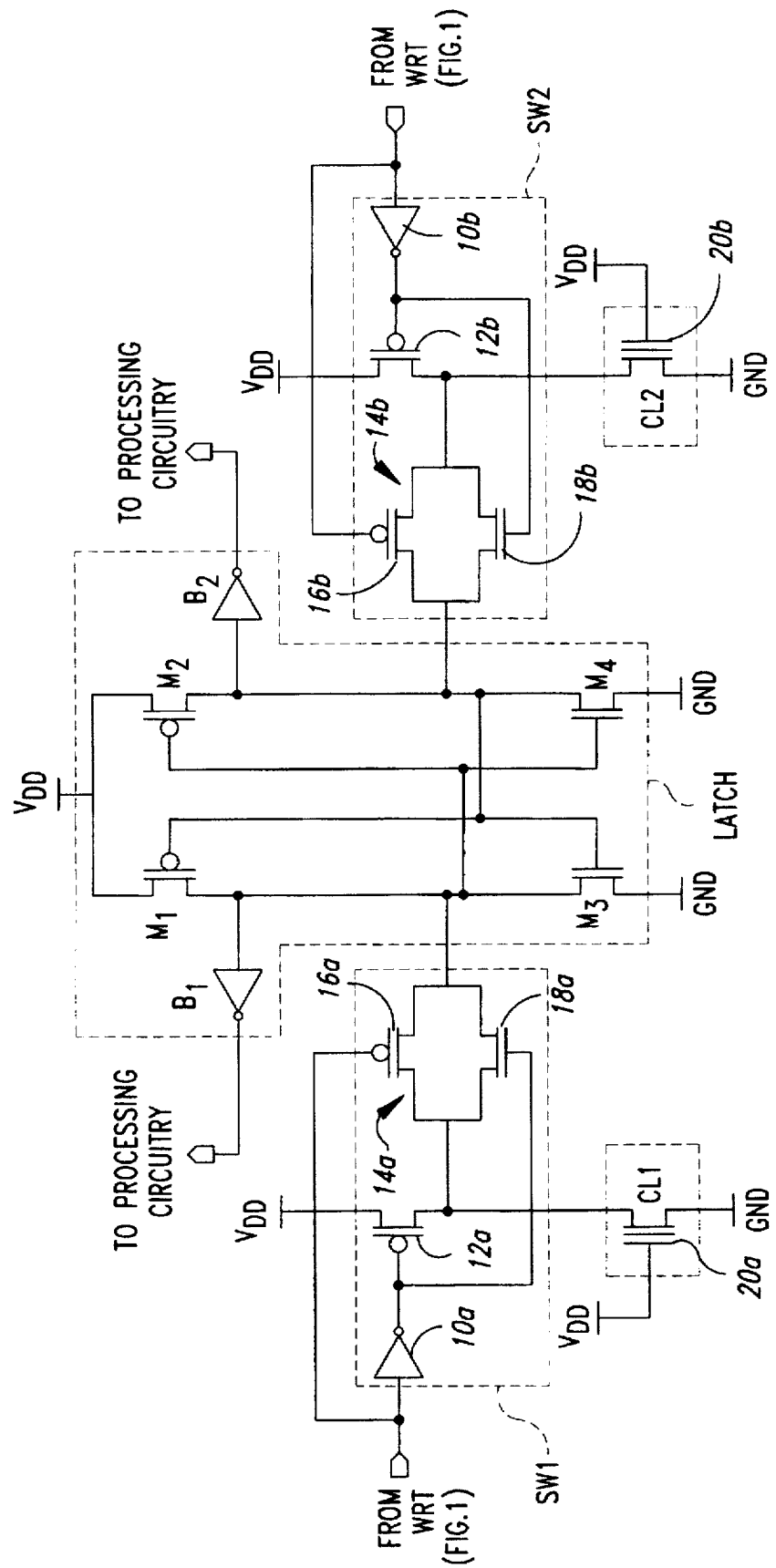
FIG. 2 is a circuit diagram of one embodiment of the memory element and the read circuit of FIG. 1 where they are adapted for integration using a CMOS type of technology.

In accordance with another aspect of the invention, the read circuit of the memory element comprises switching circuit elements SW1 and SW2 instead of a POR circuit, and additionally comprises a flip-flop type of circuit LATCH. Typically, the switching circuit elements SW1 and SW2 are electronic switches comprising transistors (FIG. 2).

Where the memory elements are used in a redundancy circuit, the switch elements SW1 and SW2 enable a write step during the device testing by coupling a programming circuit means represented by a block WRT to memory cells CL1 and CL2, respectively. Programming circuit means suitable for composing block WRT are well known.

With the storage device in operation, SW1 and SW2 couple CL1 and CL2, respectively, to the LATCH circuit. This coupling enables read steps whereby information contained in the memory element is stored into the flip-flop circuit for processing in further circuit sections.

According to still another aspect of the invention, during the write step which may, as mentioned, correspond to the storing of addresses of faulty elements of a memory matrix into registers of redundancy circuits, only one cell, CL1 or CL2, is programmed, the other being left deliberately clear or erased.

Unlike existing reset circuits, as the device is turned on, the two switching circuit elements SW1 and SW2 become operative when the flip-flop circuit is powered, and their power consumption is approximately zero.

When one of the two memory cells CL1 or CL2 is programmed at a logic "1" (and the other remains in its initial erased state of logic "0"), upon the device being turned on, the cells will drive the flip-flop circuit to a definite state. This state is the information that is stored into the flip-flop circuit, regardless of its initial setting, and it can be used by the device processing sections with no possibility for the information in the cells to be altered. Because cells CL1 and CL2 are non-volatile, each retains its logic state, regardless of how often the device is powered up and down. Advantageously, the flip-flop circuit, being unbalanced and driven by the programmed cells, will unfailingly acknowledge the clear state of the other cell at each power-on.

Shown in FIG. 2 is an embodiment of the various blocks shown in FIG. 1. Switch SW1 includes an inverter 10a, a P-channel programming transistor 12a, and a coupling switch 14a that includes a P-channel transistor 16a and an N-channel transistor 18a. SW2, which is similar in structure and operation to SW1, includes inverter 10b, P-channel programming transistor 12b, and coupling switch 14b that includes P-channel transistor 16b and N-channel transistor 18b. In both SW1 and SW2, the input of inverter 10 is coupled to the circuit WRT of FIG. 1 and to the gate of transistor 16. The output of inverter 10 is coupled to the gates of transistors 12a and 18a. CL1 and CL2 include single-transistor, electrically erasable and programmable storage cells 20a and 20b, respectively. Transistors 20 of CL1 and CL2 have their sources tied to ground, their gates tied to power supply $V_{DD}$, and their drains coupled to the drains of transistors 12a and 12b, respectively. The LATCH circuit includes transistors M1, M2, M3, M4, and inverters B1 and B2, which are coupled as shown in FIG. 2. The outputs of B1 and B2 compose the complementary output terminals of the LATCH circuit, and the M1–M3 and M2–M4 coupled drain pairs comprise first and second terminals to which switches 14a and 14b are coupled. M1 and M3 form a first branch of the LATCH circuit. The input terminal of this branch is the intercoupling of the gates of M1 and M3, and the output terminal is the intercoupling of the drains of M1 and M3. The input terminal is coupled to the second terminal of LATCH, and the output terminal is coupled to the first terminal of LATCH. M2 and M4 form a second branch of the LATCH circuit. The input terminal of this second branch is the intercoupling of the gates of M2 and M4, and the output terminal is the intercoupling of the drains of M2 and M4. The input terminal is coupled to the first terminal of LATCH, and the output terminal is coupled to the second terminal of LATCH. The branches are intercoupled at the sources of M1 and M2 (coupled to $V_{DD}$) and the sources of M3 and M4 (coupled to ground).

In another aspect of the invention, B1 and B2 may be omitted, so that the first and second terminals of the LATCH circuit are the complementary output terminals of the LATCH circuit.

In operation, the complementary outputs of the LATCH circuit indicate in which one of the two possible states the LATCH circuit has been programmed. Typically, the information stored by the LATCH circuit includes one bit of the address required to map a redundant memory column (not shown) to a defective memory column (not shown). For example, when the output of B1 is logic high and the output of B2 is logic low, this is a first state. When the output of B1 is logic low and the output of B2 is logic high, this is the second state. If the LATCH is selected to store mapping information during the device testing, either ,CL1 or CL2 is programmed with a logic high. In the example described below, CL2 is programmed to a logic high and CL1 remains unprogrammed. However, to obtain the opposite state from the LATCH circuit, CL1 would be programmed while CL2 remains unprogrammed.

If, during initialing testing of the memory device, the LATCH circuit is selected to hold mapping information, the WRT circuit (FIG. 1) provides a logic high to the input of inverter 10b and a logic low to the input of inverter 10a. The gate voltage of transistor 20b is raised to a first programming voltage, which in one aspect of the invention is approximately 12.5 volts, and the source of transistor 12b is raised to a second programming voltage, which in one aspect of the invention is approximately 6.25 volts. Because transistor 12b is in a conducting state, it couples the second programming voltage to the drain of CL2. Thus, CL2 is programmed to a logic 1 state. Because transistor 12a is nonconducting, transistor 20a remains in an unprogrammed state.

Upon initial power up, or upon the return from an interruption in the power supply, the inputs to both inverters 10a and 10b are at a logic low. Thus, switches 14a and 14b are in the closed or conducting state. Because CL1 is in an unprogrammed state, as soon as the voltage $V_{DD}$, which is coupled to the gate of transistor 20a, reaches a predetermined threshold voltage, which in one aspect of the invention is approximately 2.0–2.4 volts, transistor 20a conducts and through switch 14a drives the input or B1 to a logic 0. Thus, via transistor M2, CL1 drives the input B2 to a logic 1. And thus, upon power up, non-volatile memory cells CL1 and CL2 serve to set the LATCH circuit in the desired state. Once the LATCH is set, transistors M2 and M3 conduct while transistors M1 and M4 do not. Thus, in its quiescent state, neither the LATCH, the switches S1 and S2, nor the memory cells CL1 and CL2 conduct any quiescent power. Until power is removed or sufficiently interrupted, the LATCH circuit maintains the outputs of B1 and B2 in the selected state.

As stated above, an advantage of the present invention, from both a cost and performance perspective, is that no reset circuit is required to reset the flip-flop circuit upon device power up.

It will be appreciated that various alterations or substitutions may be made to the disclosed embodiments without departing from the spirit and scope of the invention.

I claim:

1. A memory element of the programmable type with a read circuit featuring zero consumption in the quiescent state, the memory element comprising:

a bistable circuit having at least first and second terminals;

first and second switching circuit elements;

first and second non-volatile memory transistors each having a source and a drain, the bistable circuit being connected between said transistors with the first and second terminals and coupled thereto through the first and second switching circuit element, respectively, said switching circuit elements operative to connect the first and second memory transistors to programming circuit means during a write step, said switching circuit elements being responsive to a change in a supply voltage to automatically connect the drains of the first and second memory transistors to the bistable circuit regardless of a power-on reset signal.

2. A memory element according to claim 1, characterized in that at least one of said first and second memory transistors is in an unprogrammed state after the write-step.

3. A memory element according to claim 1, characterized in that the first and second switching circuit elements are electronic switches.

4. A memory element according to claim 1, characterized in that the electronic switches each comprise mutually complementary transistors.

5. A memory element according to claim 1, characterized in that the first and second non-volatile memory transistors are of the field-effect transistor type.

6. A memory element according to claim 1, characterized in that the bistable circuit comprises first and second inverters connected in a loop, the first and second terminals of the bistable circuit being circuit linking nodes between the first and second inverters.

7. A memory element as claimed in claim 1 wherein the memory element holds a portion of a redundancy address in a redundancy circuit.

8. A memory element that can be programmed with a programming circuit, comprising:

a bistable circuit having first and second terminals and operable to dissipate substantially zero power in a quiescent state;

first and second nonvolatile memory transistors each having a source and a drain; and first and second switching elements interposed between said first and second memory transistors and said first and second terminals respectively, said switching elements operable to couple said memory transistors to said programming circuit during a write and said switching elements responsive to a rise in a supply voltage to automatically couple said drains of said memory transistors to said terminals regardless of a power-on reset signal.

9. The memory element of claim 8 wherein each of said switching elements comprises a pair of complementary transistors coupled in parallel and interposed between a respective memory transistor and a respective terminal of said bistable circuit.

10. The memory element of claim 8 wherein said memory transistors each comprise a field-effect transistor having a floating gate.

11. The memory element of claim 8 wherein said bistable circuit comprises:

a first branch having an input terminal coupled to said second terminal and an output terminal coupled to said first terminal; and a second branch having an input terminal coupled to said first terminal and an output terminal coupled to said second terminal.

12. The memory element of claim 11 wherein each of said branches comprises a pair of transistors each having a gate coupled to said input terminal of said branch and a drain coupled to said output terminal of said branch.

13. In an integrated circuit, a memory device for automatically reading the memory transistors in response to a change in a supply voltage, the memory device comprising:

a latch having first and second inputs;

first and second nonvolatile memory transistors; and a first switch connected between the first memory transistor and the first input;

a second switch connected between the second memory transistor and the second input, the switches being responsive to the change in the supply voltage to automatically connect the memory transistors to the first and second inputs regardless of a power-on reset signal.

14. The memory device of claim 13 wherein the switches connect the memory transistors to a programming circuit during programming of the memory transistors.

15. The memory device of claim 13 wherein the switches automatically connect the memory transistors to the first and second inputs upon power-on of the integrated circuit.

16. The memory device of claim 13 wherein each switch includes a pair of complementary transistors connected in parallel and interposed between a respective memory transistor and a respective input of the latch.

17. In an integrated circuit, a memory device for automatically reading the memory transistors regardless of a power-on reset signal, the memory device comprising:

a bistable circuit having first and second inputs;

first and second nonvolatile memory transistors;

a first switch connected between the first memory transistor and the first input of the bistable circuit; and a second switch connected between the second memory transistor and the second input of the bistable circuit, the switches being responsive to a rise in the supply voltage upon power-on of the integrated circuit to automatically connect the memory transistors to the first and second inputs of the bistable circuit regardless of the power-on reset signal.

18. The memory device of claim, 13 wherein each of the memory transistors has a control terminal receiving the supply voltage.

* * * * *

UNITED STATES PATENT AND TRADEMARK OFFICE
CERTIFICATE OF CORRECTION

PATENT NO. : 5,696,716
DATED : December 9, 1997
INVENTOR(S) : Paolo Rolandi

It is certified that error appears in the above-identified patent and that said Letters Patent is hereby corrected as shown below:

In column 8, line 1, after "claim" delete ","

Signed and Sealed this

Fifteenth Day of December, 1998

Attest:

BRUCE LEHMAN

Attesting Officer

Commissioner of Patents and Trademarks